April 7, 1959 W. K. DAUKSHER ET AL 2,881,321

VARIABLE FREQUENCY CRYSTAL CONTROLLED OSCILLATOR

Filed Aug. 30, 1957

2 Sheets-Sheet 1

INVENTORS.
W. K. DAUKSHER
SHELDON FOX
BY Wade Koontz
ATTORNEY
James S. Shannon
AGENT April 7, 1959 W. K. DAUKSHER ET AL 2,881,321

VARIABLE FREQUENCY CRYSTAL CONTROLLED OSCILLATOR

Filed Aug. 30, 1957

2 Sheets-Sheet 2

INVENTORS.
W. K. DAUKSHER
SHELDON FOX
BY Wade Koontz
ATTORNEY
James S. Shannon
AGENT 2,881,321

VARIABLE FREQUENCY CRYSTAL CONTROLLED OSCILLATOR

Walter J. Dauksher, Jamaica, and Sheldon Fox, Brooklyn, N.Y., assignors to the United States of America as represented by the Secretary of the Air Force Application August 30, 1957, Serial No. 681,424

3 Claims. (Cl. 250—36)

In MTI (moving target indication) radar systems of the coherent phase type the local oscillator must have exceptional short term (pulse-to-pulse) frequency stability. This requirement results from the method used in MTI radar to detect a radially moving target, which is to sense the characteristic Doppler phase shift in the return from a moving target by comparing the phase of the echo signal at intermediate frequency with the phase of an intermediate frequency reference signal which is coherent in phase with the transmitted wave. Consequently, any change in the frequency of the local oscillator during the interval between the transmitted pulse and the received echo results in a change in the phase of the echo when converted to intermediate frequency and leads to a false moving target indication. In addition to the stability requirement, the frequency of the local oscillator should be adjustable over a sufficient range to permit the use of AFC (automatic frequency control) in the MTI system.

The object of the invention is to provide an oscillator having adequate short term stability for the above described use, or other similar use, and variable in frequency at least to the extent required in AFC systems. A local oscillator which obtains the required frequency by multiplication of a lower fundamental frequency generated by a crystal controlled oscillator satisfies the stability requirements, but a crystal controlled oscillator has a tuning range of only about 0.25%. More specifically, therefore, it is the object of the invention to provide an oscillator having the frequency stability provided by crystal control and a tuning range adequate to permit its use in AFC systems.

Briefly, this object is accomplished by providing an oscillator with a plurality of crystals covering adjacent slightly overlapping frequency bands, together with coupled tuning and switching means for connecting the crystals into the oscillator circuit in succession and for tuning each crystal so connected over its approximately 0.25% tuning range. A sufficient number of crystals are used to provide the desired tuning range. The frequency produced by this oscillator is then raised to the desired value by multiplication, the multipliers and amplifiers used in this process being designed with sufficient bandwidths to accommodate the frequency range of the crystals.

Figure 1:
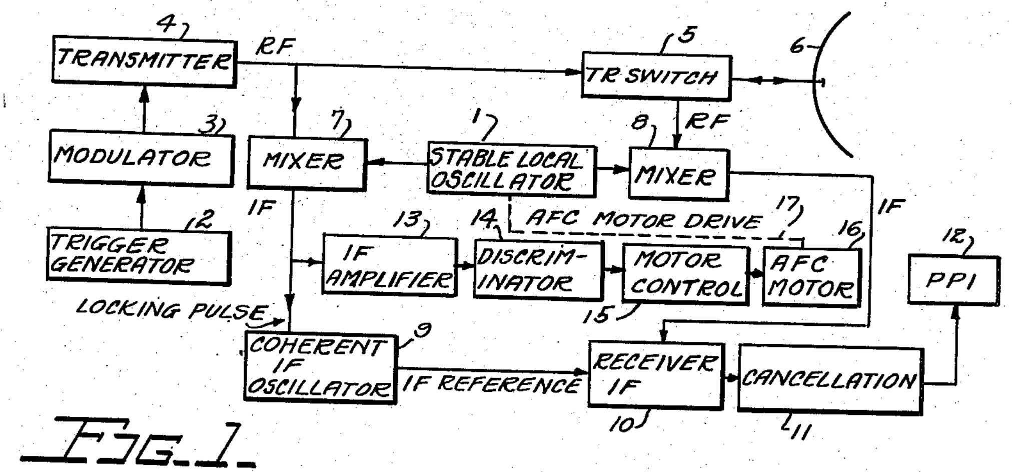
Figure 4:
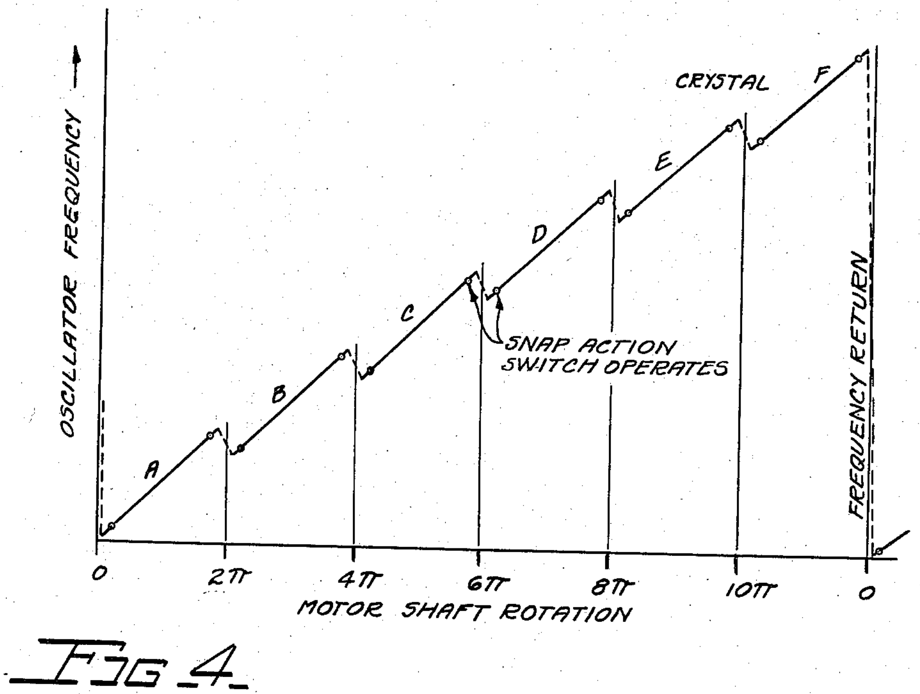
Figure 2:
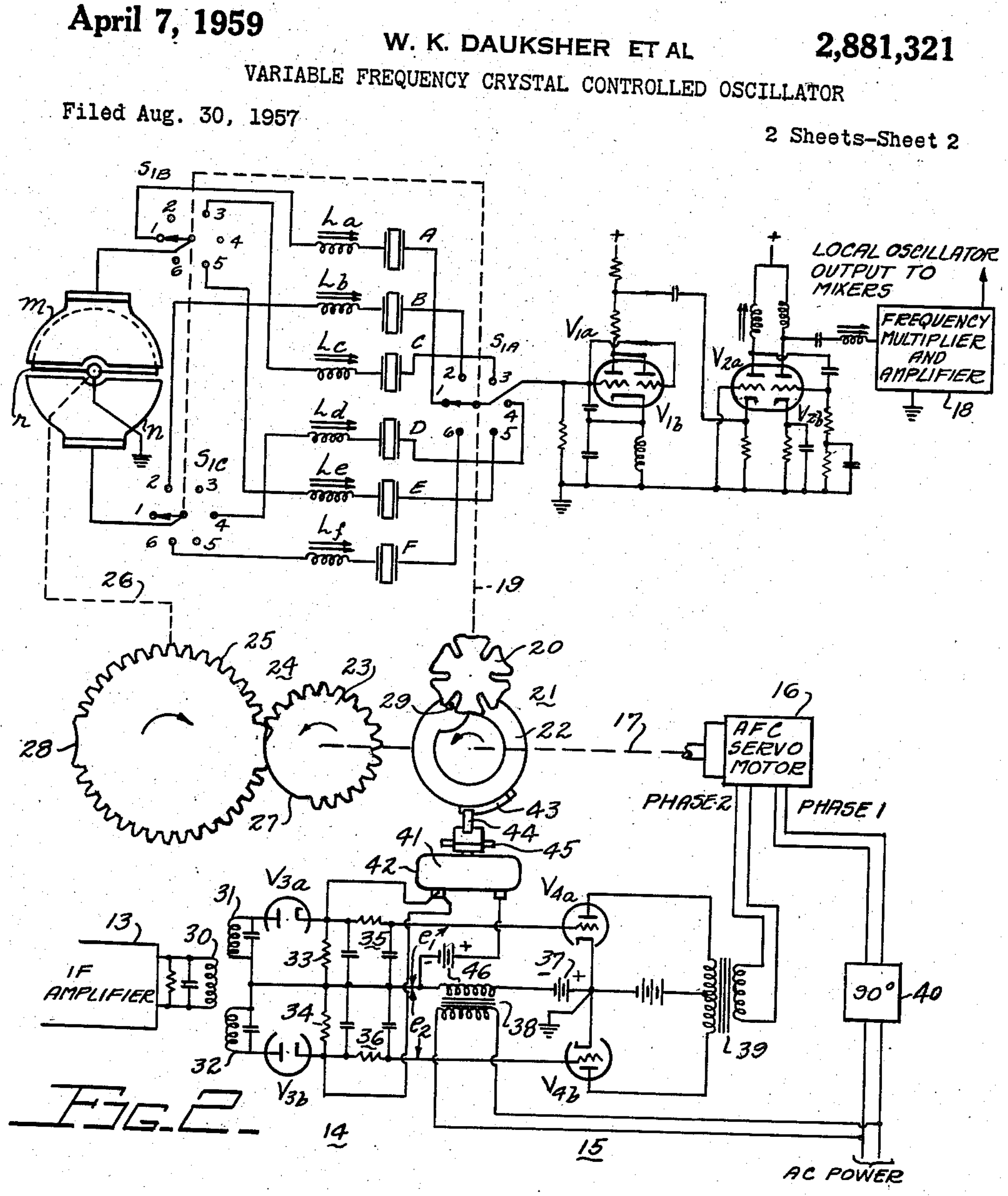
Figure 3:
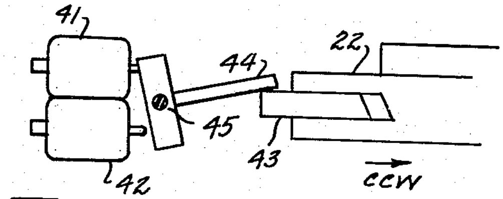

A more detailed description of the invention will be given with reference to the specific embodiment thereof shown in the accompanying drawings in which Fig. 1 shows a typical MTI radar system in which the invention may be used, Fig. 2 is a schematic representation of the variable frequency oscillator in accordance with the invention, Fig. 3 shows an additional view of the snap-action switch mechanism of Fig. 2 and Fig. 4 shows the frequency characteristic of the oscillator of Fig. 2.

Referring to Fig. 1, the oscillator described herein may be used for the stable local oscillator 1 of the MTI radar system shown in this figure. The operation of MTI radar systems is well understood in the art and described in the literature, for example, in chapter 16 of Radar System Engineering—Ridenour, Radiation Laboratory Series, volume I, McGraw-Hill, and need not be discussed in detail. Briefly, however, trigger generator 2 operates through modulator 3 to cause transmitter 4 to produce periodically recurring pulses of RF (radio frequency) energy which are applied through transmit-receive network 5 to antenna 6 and radiated into space. The RF transmitter pulses are also applied to mixer 7 and the RF echo pulses received by antenna 6 are applied through TR network 5 to mixer 8, these pulses beating with the local oscillator frequency in mixers 7 and 8 to produce IF (intermediate frequency) transmitter and echo pulses in their respective outputs, the IF pulses having the same relative phase as the RF transmitter and echo pulses. The output of mixer 7 is used as a locking pulse to start the coherent IF oscillator 9 at the same phase as the IF locking pulse. The output of coherent oscillator 9, which is an oscillator of very high short term stability, serves as a reference phase for comparison in receiver 10 with the phase of the IF echo signal. The receiver 10 consists essentially of an IF amplifier, second detector and video amplifier. In the case of a stationary target, the IF echo pulses have the same frequency as the IF reference signal; hence there is no relation phase change between the two signals from pulse to pulse and the receiver output pulses are of constant amplitude. In the case of a moving target, however, the IF echo pulses differ in frequency from the IF reference signal due to the Doppler effect and therefore the phase of the IF echo relative to the IF reference changes from pulse to pulse. As a result, the output of receiver 10, in the case of a moving target, varies in amplitude at the Doppler frequency. Finally, the cancellation circuit 11 by subtracting each receiver output pulse from the next preceding output pulse and producing an output only when successive output pulses differ in amplitude, eliminates the fixed target video signals and applies only video signals representing moving targets to the indicator 12.

In order to maintain the IF in the above MTI system constant at the value for which the IF amplifiers of receiver 10 are designed and thus keep the system properly tuned in the presence of instability in transmitter frequency, an AFC system is provided comprising IF amplifier 13, discriminator 14, motor control 15 and servo motor 16 which adjusts the frequency of local oscillator 1 through shaft 17. AFC systems are well known in the art and adequately described in the literature, for example, on pages 453–457 of the above cited text Radar System Engineering and also in chapter 7 of Microwave Mixers—Pound, Radiation Laboratory Series, volume 16, McGraw-Hill. Considered briefly, the output of mixer 7 is applied, after amplification, to discriminator 14 which produces a direct voltage error signal having a predetermined amplitude which may be zero, when the applied IF is correct, and varying above or below this value when the frequency of the applied wave is above or below the correct intermediate frequency. Motor control circuit 15 and motor 16 operate in the presence of an error signal to change the frequency of local oscillator 1 in such direction as to return the error signal to the value representing the correct IF. The operation is essentially one of negative feedback and with sufficient sensitivity the AFC system can maintain the intermediate frequency at substantially a fixed value.

The necessity for exceptional short term stability in local oscillator 1 of the MTI system of Fig. 1 is clear. If the frequency of this oscillator should change during the interval between the transmitted pulse and the received echo the frequency of the IF echo signal and therefore its phase relative to the IF reference signal would be affected. Since the operation of the system depends upon sensing the Doppler phase shift of the echoes from a moving target, spurious phase changes in the IF echoes due to local oscillator instability result in erroneous moving target information being applied to the indicator.

The oscillator shown in Fig. 2 provides the short-term stability required for MTI together with a continuous tuning range sufficiently wide for AFC requirements. Basically, the oscillator comprises a crystal controlled modified Colpitts oscillator, incorporating tubes $V_{1a}$ and $V_{1b}$, operating at a comparatively low frequency. This fundamental frequency is applied to a tripler $V_{2a}$ and amplifier $V_{2b}$, and then subjected to still further multiplication and amplification in circuit 18 to attain the desired local oscillator frequency at the required amplitude. These circuits are designed to have sufficient band width to pass the required range of frequencies.

The modified Colpitts oscillator incorporating tube $V_1$ is crystal controlled, the crystal being connected in series with an inductance and a tuning capacitor between the control grids and ground, the series circuit acting, in effect, as an inductance between these two points. The tuning capacitor has a grounded rotor $r$ and identical stators $m$ and $n$ arranged for differential variation of the capacitances $C_{rm}$ and $C_{rn}$, the maximum and minimum values of which are equal. With switch $S_1$ in position 1, the above described series circuit consists of lowest frequency crystal A, inductance $L_a$ and tuning capacitor $C_{rm}$. With $S_1$ in position 2, the series circuit consists of crystal B, inductance $L_b$ and tuning capacitor $C_{rn}$, and so on until in position 6 the highest frequency crystal F is connected into the circuit. The inductances $L_a$–$L_f$ are made individually adjustable to compensate for minor variations in crystal shunt capacitance from crystal to crystal. With an AT-cut crystal capacitor $C_{rm}$ or $C_{rn}$ is capable of tuning the associated crystal over a range of approximately 0.25%.

The switch $S_1$ and the rotor $r$ of the tuning capacitor are driven from shaft 17 in a correlated fashion that will now be described. Switch $S_1$ is driven by shaft 19 from driven member 20 of Geneva mechanism 21, the driving member 22 of which is mounted on shaft 17. Also mounted on shaft 17 is driving gear 23 of intermittent gear drive 24, the driven gear 25 of which is coupled to tuning capacitor rotor $r$ through shaft 26. Shaft 17 is rotatable continuously in either direction. It is shown being rotated counterclockwise in the drawing and at the point of just having advanced $S_1$ through the Geneva mechanism, from position 6 to position 1 connecting the lowest frequency crystal A into the circuit. During the transition of $S_1$ from position 6 to position 1, gear 25 was held locked in the position shown by surface 27 of gear 23 so that $C_{rm}$ had its maximum value at the time $S_1$ reached position 1 and crystal A was connected into the circuit. At this point, therefore, the oscillator operates at its lowest frequency. As counterclockwise rotation of shaft 17 continues $S_1$ is held in position 1 by the Geneva mechanism and gear 25 is driven by gear 23 causing rotor $r$ of the tuning capacitor to rotate clockwise and the value of $C_{rm}$ to decrease thus increasing the frequency of the oscillator. After gear 25 has been rotated exactly 180°, it will be locked in this position by surface 27 of gear 23 acting against surface 28 of gear 25. In this position $C_{rm}$ has its minimum value and the frequency of the oscillator is the highest obtainable with crystal A. Shortly after this point is reached continued counterclockwise rotation of shaft 17 causes pin 29 of the Geneva mechanism to engage wheel 20 moving $S_1$ from position 1 to position 2, gear 25 and rotor $r$ being held in the maximum $C_{rn}$ position during the switching process by surface 27 of gear 23 as before. When $S_1$ reaches position 2, crystal B is connected into the circuit and, since $C_{rn}$ has its maximum value, the frequency of the oscillator is the lowest attainable with this crystal. This frequency is made to be slightly below the highest frequency of crystal A, the slight overlap insuring that no break will occur in the frequency spectrum of the oscillator. Further counterclockwise rotation of shaft 17 causes $C_{rn}$ to decrease and the frequency to rise until, as before, the tuning capacitor reaches its maximum value and the oscillator frequency is the highest attainable with crystal B. Continued counterclockwise rotation causes the above process to continue until finally capacitor $C_{rn}$ reaches its minimum value with $S_1$ in position 6 at which point the oscillator has its highest frequency. Continued clockwise rotation beyond this point causes $S_1$ to move to position 1 and the oscillator frequency to drop to its lowest value. The operation of clockwise rotation of shaft 17 is identical to that described above for counterclockwise rotation except that in this case when $S_1$ moves from one position to the next lower position the tuning capacitor ($C_{rm}$ or $C_{rn}$) has its minimum value so that continued clockwise rotation of the shaft reduces the oscillator frequency.

As seen from the above, the oscillator of Fig. 2, can be continuously varied up or down through a frequency range equal to the combined ranges of crystals A–F less the overlap of adjacent crystals. The oscillator is therefore suitable for use in motor driven AFC systems. One possible embodiment of the AFC system shown in block form in Fig. 1 is illustrated in Fig. 2. The output of IF amplifier 13 is applied to discriminator 14 through an input transformer having a primary winding 30 and equally coupled secondary windings 31 and 32. Primary winding 30 is broadly tuned to the correct IF whereas secondary windings are more sharply tuned with the resonant frequency of one of the windings, for example, winding 31, slightly above the correct IF and with the resonant frequency of the other winding 32 an equal distance below the correct IF. The voltage across winding 31 is rectified by $V_{3a}$ with the resulting direct potential developed across resistor 33. Similarly the voltage at winding 32 is rectified by $V_{3b}$ and the remitting direct voltage is developed across resistor 34. Because of the pulsed nature of the applied IF the outputs of $V_{3a}$ and $V_{3b}$ are applied to integrating circuits 35 and 36, respectively, to obtain smooth direct voltages $e_1$ and $e_2$. When the output of amplifier 13 is at the correct intermediate frequency the voltages across secondary windings 31 and 32 are equal and $e_1=e_2$, when the output is at a frequency higher than the correct value the secondary 31 voltage exceeds the secondary 32 voltage and $e_1$ exceeds $e_2$, and when the output is at a frequency lower than the correct value the secondary 32 voltage exceeds the secondary 31 voltage and $e_2$ exceeds $e_1$. A comparison of $e_1$ and $e_2$ therefore serves to indicate the magnitude and direction of any departure of the actual IF from the prescribed value.

Motor control 15 operates in response to voltages $e_1$ and $e_2$ to control 2-phase servo motor 16 which drives the oscillator tuning shaft 17. The operation is such as to maintain $e_1=e_2$ by appropriate automatic adjustment of the local oscillator frequency. The motor control circuit comprises amplifier tubes $V_{4a}$ and $V_{4b}$ of the type in which the amplification can be controlled by controlling the grid bias. Equal negative biases are applied to the grids of both tubes by source 37 and this bias is opposed by the positive voltages $e_1$ and $e_2$. Variations in $e_1$ and $e_2$ therefore cause variations in the amplification of the associated tubes $V_{4a}$ and $V_{4b}$. The voltage of the A.C. power source is applied to the grids of the two amplifier tubes in the same amplitude and phase by transformer 38. The net outputs from $V_{4a}$ and $V_{4b}$ is applied to phase 2 of 2-phase motor 16 by way of center tapped output transformer 39, phase 1 of the motor being energized continuously from the power source through 90° phase shifting network 40.

It is evident from the above described circuit that when $e_1=e_2$ the gains of tubes $V_{4a}$ and $V_{4b}$ are equal and, since their outputs oppose each other in the center-tapped primary, there is no net output from transformer 39 and no energization of phase 2. Motor 16 therefore does not run. This is the condition that exists when the intermediate frequency has the correct value. Should the IF tend to increase above the correct value $e_1$ would become greater than $e_2$ and the output of $V_{4a}$ would exceed that of $V_{4b}$. The resulting energization of phase 2 of the motor would cause the motor to run in a counterclockwise direction to increase the local oscillator frequency and thus oppose the rise in intermediate frequency. Should the IF tend to decrease below the correct value $e_2$ would become greater than $e_1$, and the output from $V_{4b}$ would predominate resulting in a 180° shift of phase 2 from its phase when, as above, the output of $V_{4a}$ predominated. Motor 16 accordingly would then run in the reverse or clockwise direction to decrease the local oscillator frequency and thus oppose the decrease in intermediate frequency below the predetermined correct value.

When switch $S_1$ is actuated to change crystals there is a short interval while the contact arm is passing between adjacent contacts that no crystal is connected in the circuit. During this period oscillations cease and with no local oscillator there is no IF output from mixer 7 and IF amplifier 13. Therefore, during this interval, $e_1$ and $e_2$ are zero and phase 2 of the motor 16 is deenergized. In order to prevent the motor from stopping during this interval and to insure completion of the transition between crystals, provision is made to apply a fictitious error signal to the cathode of $V_{3a}$ or $V_{3b}$ to maintain motor operation during the switching interval. The fictitious error signal is applied shortly before the $S_1$ contacts open and is removed shortly after they close and operation of the local oscillator is restored. The foregoing is accomplished by single pole sensitive snap-action switches 41 and 42 shown in Figs. 2 and 3. These switches are actuated by a cam 43 mounted on driving element 22 of the Geneva mechanism and cooperating with cam follower 44 which pivots about pin 45. The cam has oppositely inclined end surfaces such that when follower 44 is engaged in the counterclockwise direction of shaft 17, it is forced upward and over the top of the cam thereby actuating and holding closed switch 41, and when engaged in the clockwise direction of shaft 17 is forced downward and beneath the cam thereby actuating and holding closed switch 42. For example, in a crystal transition resulting from counterclockwise rotation of shaft 17, cam 43 closes switch 41 just prior to the opening of the $S_1$ contacts by the Geneva mechanism. Closure of switch 41 applies a positive potential from source 46 to the cathode of $V_{3a}$. This fictitious error signal keeps motor 16 running in a counterclockwise direction thereby causing the switching operation to be completed. Shortly after $S_1$ has closed and oscillation of the local oscillator is restored, follower 44 falls off the end of cam 43, as it is shown about to do in Fig. 2, opening switch 41 and removing the fictitious error signal. In a similar manner, operation of $S_1$ by clockwise rotation of shaft 17 causes switch 42 to apply the fictitious error signal to the cathode of $V_{3b}$ to continue clockwise rotation of motor 16 during the switching operation.

Fig. 4 shows the frequency characteristic of the oscillator of Fig. 2. The circles near the ends of the characteristic of each crystal indicate the points at which operations of snap-action switches 41 and 42 take place. The dotted lines connecting the ends of the individual crystal characteristics indicate the period of shaft rotation when $S_1$ is open and the circuit is in a non-oscillating state. The overlap of the adjacent crystal characteristics is apparent in this figure and insures a complete frequency spectrum.

We claim:

1. A crystal controlled oscillator tunable over a band of frequencies comprising: an oscillator circuit; a plurality of crystal elements each tunable over one of an equal number of relatively narrow, consecutive and slightly overlapping frequency ranges, said frequency ranges extending over said band of frequencies; a tuning device for said crystal elements; switching means for connecting said crystal elements and said tuning device operatively into said oscillator circuit, said crystal elements being connected one at a time and consecutively in the order of their frequency ranges; and a tuning control mechanism for alternately actuating said switching means and said tuning device to tune said oscillator over said band of frequencies, said tuning control mechanism acting when said switching means is being actuated to hold said tuning device at one end of its tuning range and acting when said tuning device is being actuated to prevent operation of said switching means.

2. A crystal controlled oscillator tunable over a band of frequencies comprising: an oscillator circuit; a plurality of crystal elements each tunable over one of an equal number of relatively narrow, consecutive and slightly overlapping frequency ranges extending over said band of frequencies; a tuning device for said crystal elements, said tuning device having a common terminal permanently connected to said oscillator circuit and two input terminals and providing a capacitance between each of said input terminals and said common terminals, and further having a control shaft continuously rotatable in either direction and producing in each revolution complete inverse cycles of variation of said capacitances between equal maximum and minimum values; switching means continuously rotatable in either direction for connecting said crystal elements one at a time into said oscillator circuit by way of one of said tuning device input terminals, said crystals being connected in succession in the order of their frequency ranges and the tuning device input terminal to which each crystal is connected being different from that to which the crystals of adjacent frequency ranges are connected; an oscillator tuning shaft; a first intermittent drive mechanism between said tuning shaft and said switching means for switching between adjacent crystal elements during a minor portion of each revolution of said shaft, and holding said switching means against actuation during the remaining portion of each revolution; and a second intermittent drive mechanism between said tuning shaft and said control shaft, said second intermittent drive acting during said minor portion of each revolution of said tuning shaft to hold said control shaft in a position at which one of the capacitances of said tuning device has a maximum value and acting during the remaining portion of each tuning shaft revolution to rotate said control shaft through one-half revolution.

3. Apparatus as claimed in claim 2 and in combination therewith a mixer, means for applying radio frequency energy and the frequency of said tunable oscillator to said mixer to produce an intermediate frequency, a discriminator having said intermediate frequency applied thereto and operating when said intermediate frequency deviates from a prescribed value to produce an error signal containing information as to the direction of the deviation, a bidirectional servo motor coupled to said tuning shaft, a motor control circuit to which said error signal is applied for energizing said motor in the presence of an error signal and controlling its direction of rotation in accordance with the error signal, and means actuated by said tuning shaft and operative during that portion of each revolution of said shaft beginning shortly prior to the instant one crystal element is disconnected from said oscillator by said switching means and ending shortly after the next succeeding crystal element is connected, said last named means while operative applying a fictitious error signal to said motor control circuit calling for the direction of rotation of said servo motor that was in effect when said last named means was actuated.

References Cited in the file of this patent

UNITED STATES PATENTS

| | | |
|---|---|---|
| 2,487,857 | Davis | Nov. 15, 1949 |
| 2,790,079 | Dodington | Apr. 23, 1957 |